United States Patent
Grutzeck et al.

(10) Patent No.: US 10,488,650 B2
(45) Date of Patent: Nov. 26, 2019

(54) MICROMECHANICAL COMPONENT AND METHOD FOR ADJUSTING AN ADJUSTABLE PART SIMULTANEOUSLY ABOUT TWO AXES OF ROTATION INCLINED IN RELATION TO ONE ANOTHER

(71) Applicant: Robert Bosch GmbH, Stuttgart (DE)

(72) Inventors: Helmut Grutzeck, Kusterdingen (DE); Joerg Muchow, Reutlingen (DE); Mirko Hattass, Stuttgart (DE); Stefan Mark, Reutlingen (DE); Thorsten Balslink, Kirchentellinsfurt (DE); Frank Schatz, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/604,065

(22) Filed: May 24, 2017

(65) Prior Publication Data

US 2017/0343795 A1 Nov. 30, 2017

(30) Foreign Application Priority Data

May 24, 2016 (DE) ........................ 10 2016 208 924

(51) Int. Cl.
*G02B 26/08* (2006.01)
*B81B 3/00* (2006.01)
*G02B 26/10* (2006.01)

(52) U.S. Cl.
CPC .......... *G02B 26/085* (2013.01); *B81B 3/0045* (2013.01); *B81B 3/0062* (2013.01); *G02B 26/0858* (2013.01); *G02B 26/0866* (2013.01); *B81B 2201/042* (2013.01);
(Continued)

(58) Field of Classification Search
CPC ............. G02B 26/0841; G02B 26/105; G02B 26/085; G02B 26/0858; G02B 26/0833; G02B 26/101; B81B 3/0083; B81B 3/0086; B81B 2203/04
See application file for complete search history.

(56) References Cited

U.S. PATENT DOCUMENTS

| 6,108,118 A * | 8/2000 | Minamoto | G02B 26/105 |
| | | | 310/36 |
| 6,463,190 B1 * | 10/2002 | Kato | G02B 6/3514 |
| | | | 385/16 |

(Continued)

*Primary Examiner* — Jennifer D. Carruth
(74) *Attorney, Agent, or Firm* — Maginot, Moore & Beck LLP

(57) ABSTRACT

A micromechanical component includes an adjustable part, a mounting, at least one bending actuator, and a permanent magnet. The part is positioned on the mounting so as to be adjustable relative to the mounting about a first rotation axis and about a second rotation axis inclined relative to the first axis. The actuator includes at least one movable subregion. Movement of the subregion results in a restoring force that moves the part about the first axis. The part is connected indirectly to the magnet to be adjustable about the second axis of rotation via a magnetic field built up by the magnet together with a yoke device of the component or an external yoke. A micromirror device includes the micromechanical component. A method for adjusting the part includes adjusting the part simultaneously about the first and the second axes.

13 Claims, 4 Drawing Sheets

(52) U.S. Cl.
   CPC . *B81B 2203/0163* (2013.01); *B81B 2203/056* (2013.01); *B81B 2203/058* (2013.01); *G02B 26/101* (2013.01)

(56) References Cited

U.S. PATENT DOCUMENTS

| | | | |
|---|---|---|---|
| 8,422,109 B2* | 4/2013 | Terada | B41J 2/471 359/224.1 |
| 8,488,224 B2* | 7/2013 | Brown | G02B 26/0841 359/199.2 |
| 8,508,826 B2 | 8/2013 | Terada et al. | |
| 2011/0032590 A1* | 2/2011 | Terada | G02B 26/0858 359/199.4 |

* cited by examiner

MICROMECHANICAL COMPONENT AND METHOD FOR ADJUSTING AN ADJUSTABLE PART SIMULTANEOUSLY ABOUT TWO AXES OF ROTATION INCLINED IN RELATION TO ONE ANOTHER

This application claims priority under 35 U.S.C. § 119 to patent application no. DE 10 2016 208 924.2, filed on May 24, 2016 in Germany, the disclosure of which is incorporated herein by reference in its entirety.

The disclosure relates to a micromechanical component and to a micromirror device. The disclosure also relates to a method for adjusting an adjustable part simultaneously about two axes of rotation inclined in relation to one another.

BACKGROUND

U.S. Pat. No. 8,508,826 B2 describes a micromirror device which has an adjustable mirror plate that is suspended on a mounting by means of two inner springs and two outer springs. Each of the inner springs extends in each case between two piezoelectric actuators that are formed as bending arms and intended to be deformable by means of applying an electrical voltage such that the adjustable mirror plate can be adjusted about a first axis of rotation on the basis of a restoring force resulting from the deformation of the piezoelectric actuators. Furthermore, the outer springs are formed in a meandering manner and provided with further piezoelectric actuators in such a way that the adjustable mirror plate is intended to be adjustable simultaneously about a second axis of rotation, which is aligned such that it is inclined in relation to the first axis of rotation.

SUMMARY

The disclosure provides a micromechanical component, a micromirror device, and a method for adjusting an adjustable part simultaneously about two axes of rotation inclined in relation to one another.

The present disclosure provides possibilities for adjusting an adjustable part simultaneously about two axes of rotation inclined in relation to one another that have in addition to the advantages of bending actuators also the advantages of using at least one permanent magnet connected indirectly to the adjustable part. The present disclosure consequently contributes to the better adjustability of the respective adjustable part. (Especially the adjustability of the respective adjustable part about a "static axis" is improved by means of the present disclosure.) For example, by means of the present disclosure an adjusting angle range by which the respective adjustable part is adjustable can be increased and/or an expenditure of energy that has to be applied to adjust the respective adjustable part can be reduced. A reduction of a number of modes occurring is also possible.

The positive effect of the present disclosure can also be summed up by saying that the advantages of a bending actuator drive are combined with the advantages of a permanent magnet drive without this leading to a disruptive/negative influence on one of the two drives. The respective advantages are discussed in more detail below.

Preferably, the adjustable part is suspended on the mounting at least by means of at least one outer spring and at least one inner spring in such a way that the adjustable part can be adjusted with respect to the mounting while undergoing a deformation at least of the at least one inner spring about the first axis of rotation and simultaneously while undergoing a deformation at least of the at least one outer spring about the second axis of rotation. Consequently, a spring type/spring design can be chosen both for the at least one inner spring and for the at least one outer spring in harmony to produce the desired adjustability of the adjustable part about the respective axis of rotation of the two axes of rotation inclined in relation to one another.

For example, the at least one inner spring may be anchored respectively on the adjustable part at at least one point lying on the first axis of rotation and on the at least one bending actuator and/or at least one bending-actuator-carrying structure at at least one point lying on the second axis of rotation. Such a spring design of the at least one inner spring brings about a good adjustability of the adjustable part about the first axis of rotation. At the same time, this spring design provides an advantageous flexible indirect attachment of the at least one permanent magnet to the adjustable part such that a position of the at least one permanent magnet is not influenced or is scarcely influenced by a rotational movement of the adjustable part about the first axis of rotation. As explained in more detail below, this additionally ensures a low moment of inertia of the at least one permanent magnet about the second axis of rotation.

Alternatively, the at least one bending actuator and/or at least one bending-actuator-carrying structure may also be connected to the at least one permanent magnet by way of at least one intermediate spring. Equipping the micromechanical component with the at least one intermediate spring also provides the advantageous elastic indirect attachment of the at least one permanent magnet to the adjustable part such that the position of the at least one permanent magnet is not impaired or is scarcely impaired by the rotational movement of the adjustable part about the first axis of rotation.

Preferably, in this case the at least one inner spring is anchored respectively on the at least one bending actuator and/or the at least one bending-actuator-carrying structure at at least one point lying on the first axis of rotation and on the adjustable part at at least one point lying on the second axis of rotation. The at least one inner spring consequently acts on the adjustable part at the region/regions thereof of its maximum extent about the first axis of rotation.

In an advantageous embodiment, the micromechanical component comprises a control device by means of which the at least one electrical signal can be supplied to the at least one bending actuator such that the adjustable part can be set in a resonant oscillating movement with respect to the mounting about the first axis of rotation on the basis of the restoring force resulting from the adjusting movement of the at least one first subregion of the at least one bending actuator. (The first axis of rotation may consequently also be referred to as the "resonant axis".) Preferably, in this case the component's own yoke device can be operated by means of the control device such that the adjustable part can be adjusted by means of the built-up magnetic field together with the at least one permanent magnet quasi-statically about the second axis of rotation. (The second axis of rotation may therefore also be referred to as the "static axis"). This embodiment consequently combines the advantages of a resonant bending actuator drive with the advantages of a quasi-static permanent magnet drive. There is no need to accept a negative influence on one of the two drives by the other.

For example, the at least one bending actuator may in each case comprise at least one piezoelectric material, at least one thermal-effect material and/or at least one shape-memory material. Forming the at least one bending actuator in each case with the at least one piezoelectric material is especially preferred, since these materials produce relatively great forces from comparatively small actuating distances for adjusting the adjustable part about the first axis of rotation. In addition, a resonant piezoelectric drive can be operated with almost no current, and is therefore the ideal drive for high-frequency resonant adjusting movements of the respective adjustable part.

In particular, the at least one bending actuator may be formed in each case as a bimetal bending arm. It is however pointed out that the micromechanical component is not restricted to a particular type of the at least one bending actuator to allow it to be formed.

The advantages described above can also be ensured by a corresponding micromirror device.

In addition, performing the corresponding method for adjusting an adjustable part simultaneously about two axes of rotation inclined in relation to one another also provides the advantages described above. It is pointed out that the method can be developed in a way corresponding to the embodiments described above of the micromechanical component.

BRIEF DESCRIPTION OF THE DRAWINGS

Further features and advantages of the present disclosure are explained below on the basis of the figures, in which.

DETAILED DESCRIPTION

Figure 1A:
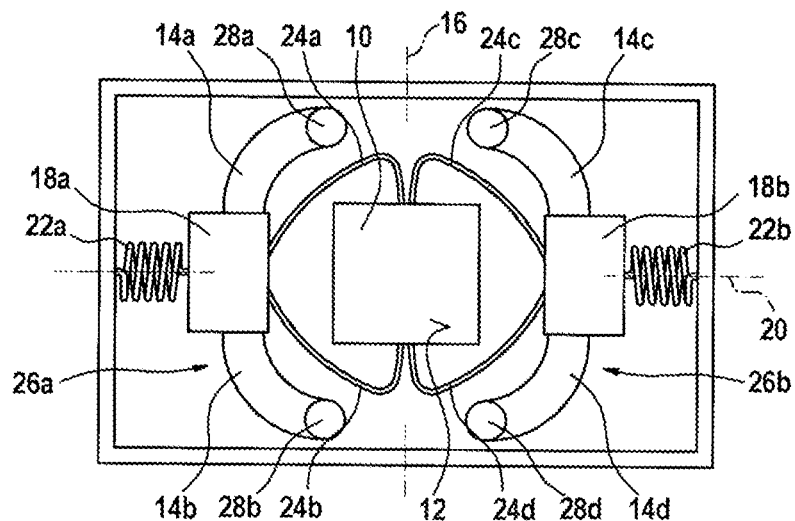
FIGS. 1a to 1c show schematic representations of a first embodiment of the micromechanical component.
Figure 1B:
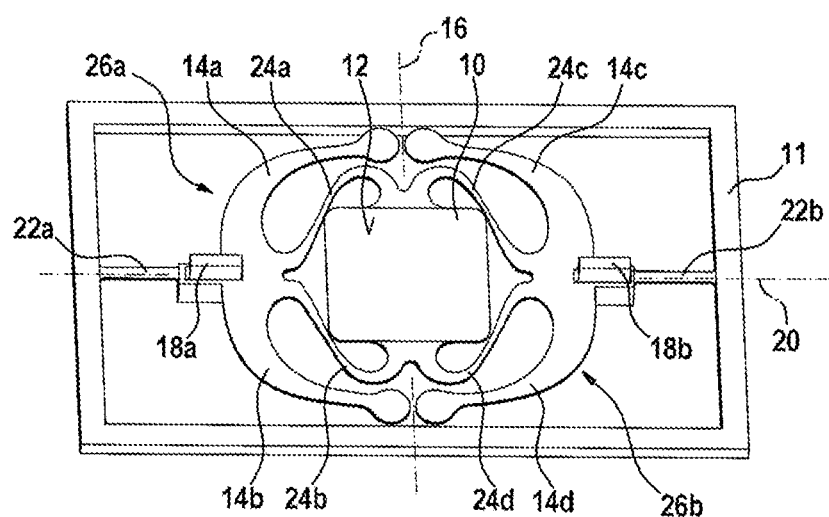
Figure 1C:
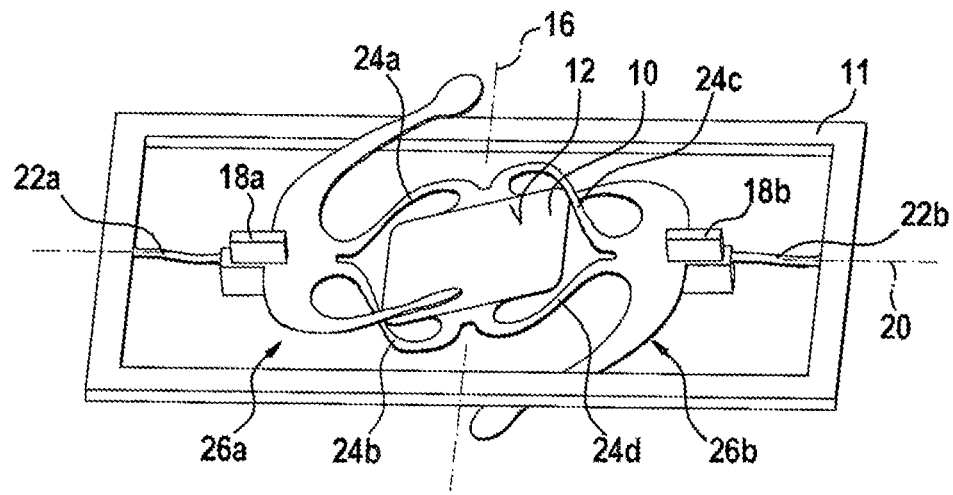

FIGS. 1a to 1c show schematic representations of a first embodiment of the micromechanical component.

The micromechanical component schematically represented in FIGS. 1a to 1c has an adjustable part 10 arranged (adjustably) on a mounting 11. By way of example, in this embodiment the adjustable part 10 is a mirror plate 10 with a reflective surface 12. The micromechanical component may consequently be in particular a micromirror device/a micromirror or advantageously be used in a micromirror device/a micromirror, such as in particular in a scanner. It is however pointed out that the micromechanical component described hereinafter is not limited to being equipped with the mirror plate 10 as the adjustable part 10 to allow it to be produced. The mounting 11 may for example be a semiconductor substrate (such as in particular a silicon substrate) or a remaining region of a patterned semiconductor substrate. The micromechanical component does not however require a particular type of mounting 11 to allow it to be produced.

The micromechanical component of the embodiments of FIGS. 1a to 1c also has at least one bending actuator 14a to 14d, which is formed in such a way and to which at least one electrical signal can be supplied (or is supplied during operation of the micromechanical component) such that in each case a first subregion of the at least one bending actuator 14a to 14d can be set/is set in an adjusting movement with respect to in each case a second subregion of the respective bending actuator 14a to 14d while undergoing an at least partial deformation of the bending actuator 14a to 14d (activated in each case by means of the at least one electrical signal). The adjusting movement of the at least one first subregion of the at least one bending actuator 14a to 14d (with respect to in each case the second subregion of the respective bending actuator 14a to 14d) results in a restoring force, by means of which (at least) the adjustable part 10 can be adjusted/is adjusted with respect to the mounting 11 about a first axis of rotation 16. The first axis of rotation 16 may for example be understood as meaning an axis centrally intersecting the adjustable part 10 and/or an axis of symmetry of the micromechanical component.

Preferably, each bending actuator 14a to 14d of the micromechanical component comprises at least one piezoelectric material. The at least one piezoelectric material should be understood as meaning a material that reacts to the at least one supplied/applied electrical signal by undergoing a deformation. Preferably, the at least one piezoelectric material is in each case arranged between two electrodes (not depicted) such that the at least one electrical signal can be applied/can be supplied to the at least one piezoelectric material by way of the two assigned electrodes. As an alternative or as an addition to the at least one piezoelectric material, however, at least one thermal-effect material and/or at least one shape-memory material may also be used for the at least one bending actuator 14a to 14d.

FIG. 1b shows the micromechanical component before the at least one electrical signal is supplied. In the situation that is schematically reproduced in FIG. 1c, the at least one bending actuator 14a to 14d is operated by means of the at least one electrical signal. By way of example, at least one of the bending actuators 14a and 14b is arranged on a first side of the first axis of rotation 16 and at least one other of the bending actuators 14c and 14d is arranged on a second side of the first axis of rotation 16. The at least one electrical signal is supplied to the bending actuators 14a to 14d such that the at least one bending actuator 14a and 14b arranged on the first side of the first axis of rotation 16 is deformed in phase opposition/phase-shifted by 180° in relation to the at least one bending actuator 14c and 14d arranged on the second side of the first axis of rotation 16. For example, a first periodic electrical signal may be supplied/applied to the at least one bending actuator 14a and 14b arranged on the first side of the first axis of rotation 16 and a second periodic electrical signal, in phase opposition/phase-shifted by 180° in relation to the first periodic electrical signal, may be supplied/applied to the at least one bending actuator 14c and 14d arranged on the second side of the first axis of rotation 16 (as the at least one electrical signal).

The micromechanical component also comprises at least one permanent magnet 18a and 18b. The at least one permanent magnet 18a and 18b is connected indirectly to the adjustable part 10 in such a way that (at least) the adjustable part 10 can be adjusted/is adjusted with respect to the mounting 11 by means of a magnetic field together with the at least one permanent magnet 18a and 18b about a second axis of rotation 20. The second axis of rotation 20 is aligned such that it is inclined in relation to the first axis of rotation 16. In particular, the second axis of rotation 20 may extend perpendicularly in relation to the first axis of rotation 16. Furthermore, the second axis of rotation 20 may also be an axis centrally intersecting the adjustable part 10 and/or a (further) axis of symmetry of the micromechanical component. It is also pointed out that the adjustable part 10 can be adjusted with respect to the mounting 11 simultaneously about the first axis of rotation 16 and about the second axis of rotation 20.

To build up/bring about the magnetic field suitable for adjusting at least the adjustable part 10 and the at least one permanent magnet 18a and 18b, either a yoke device of the component itself or an external yoke device (not of the component) may be used. The yoke device may be understood as meaning a yoke/magnetic yoke equipped with coils. Since the component described here is not restricted to a particular type of yoke to allow it to be realized, this is not discussed in any more detail here.

The micromechanical component consequently uses a bending actuator drive for adjusting the adjustable part 10 about the first axis of rotation 16 and additionally a permanent magnet drive (with the at least one permanent magnet 18a and 18b connected indirectly to the adjustable part 10) for (simultaneously) adjusting the adjustable part 10 about the second axis of rotation 20. As described in more detail below, in this way the different types of drive can be combined such that their advantages supplement one another and without operation of one of the two drives impairing a suitability for use of the other type of drive.

The use of the at least one permanent magnet 18a and 18b (connected indirectly to the adjustable part 10) for adjusting the adjustable part 10 about the second axis of rotation 20 does not require a technologically complex realization of conductor tracks and conductor track contacting on movable parts. Being able to dispense with conductor tracks and conductor track contacting that are not required for the at least one permanent magnet 18a and 18b means that there is also no need to accept damping effects of these on the adjusting movements of the adjustable part 10 about the two axes of rotation 16 and 20. The advantageous combination of the different types of drive therefore contributes to an improved adjustability of the adjustable part 10.

Furthermore, the at least one permanent magnet 18a and 18b that is used for adjusting the adjustable part 10 about the second axis of rotation 20 may be arranged directly on the second axis of rotation 20. The at least one permanent magnet 18a and 18b consequently has a comparatively low moment of inertia about the second axis of rotation 20, and an acceleration/adjusting movement of at least one center of gravity of the at least one permanent magnet 18a and 18b along a circular path is not necessary for adjusting the adjustable part 10 about the second axis of rotation 20. The "near-axis movement" of the at least one permanent magnet 18a and 18b brings about a low inertia, and consequently makes high natural frequencies possible (in particular of the "static axis").

As a difference from the at least one permanent magnet 18a and 18b, a coil body used adjustably as part of a magnetic actuator device needs conductor tracks and conductor track contacting on movable parts. Furthermore, a coil body used adjustably as part of a magnetic actuator device has a significant average distance from the axis of rotation assigned to it, and therefore has a high inertia and consequently leads to low frequencies.

The at least one permanent magnet 18a and 18b is preferably connected to the mounting 11 by way of at least one outer spring 22a and 22b. Furthermore, the indirect connection between the adjustable part 10 and the at least one permanent magnet 18a and 18b may be formed by means of at least one inner spring 24a to 24d. The adjustable part 10 is consequently suspended on the mounting 11 at least by means of the at least one outer spring 22a and 22b and the at least one inner spring 24a to 24d such that the adjustable part 10 can be adjusted with respect to the mounting 11 while undergoing a deformation at least of the at least one inner spring 24a to 24d about the first axis of rotation 16 and (simultaneously) while undergoing a deformation at least of the at least one outer spring 22a and 22b about the second axis of rotation 20. The rotational movements of the adjustable part 10 about the axes of rotation 16 and 20 inclined in relation to one another are consequently decoupled in such a way that an executed rotational movement about one of the axes of rotation 16 and 20 does not lead or scarcely leads to an impairment of the feasibility/execution of another rotational movement about another of the axes of rotation 16 and 20.

In the embodiment described here, the adjustable part is cardanically suspended, for which reason the adjustable part 10 is arranged between a first permanent magnet 18a and a second permanent magnet 18b as the at least one permanent magnet 18a and 18b. Each of the two permanent magnets 18a and 18b is connected to the mounting 11 in each case by an outer spring 22a or 22b. Furthermore, at least one inner spring 24a to 24d extends between the adjustable part 10 and each of the permanent magnets 18a and 18b. By way of example, in the embodiment described here the first permanent magnet 18a is connected to the adjustable part 10 (at least) by way of a first inner spring 24a and a second inner spring 24b (for example formed symmetrically in relation to the first inner spring 24a with respect to the second axis of rotation 20) and the second permanent magnet 18b is connected to the adjustable part 10 (at least) by way of a third inner spring 24c and a fourth inner spring 24d (for example formed symmetrically in relation to the third inner spring 24c with respect to the second axis of rotation 20).

Preferably, the at least one inner spring 24a to 24d is anchored on the at least one bending actuator 14a to 14d or on at least one bending-actuator-carrying structure 26a or 26b (see FIGS. 1b and 1c). This is more advantageous than an anchoring of the at least one inner spring 24a to 24d (directly) on the at least one permanent magnet 18a or 18b, since an additional "decoupling" of the at least one permanent magnet 18a or 18b from the adjustable part 10 is achieved by means of the "interposing" of at least one further component between the at least one permanent magnet 18a or 18b and the at least one inner spring 24a to 24d. In particular, it is in this way ensured that the position of the at least one permanent magnet 18a and 18b is not impaired or is scarcely impaired by a movement/oscillation of the adjustable part 10 about the first axis of rotation 16. The movement/oscillation of the adjustable part 10 about the first axis of rotation 16 consequently does not lead to an undesired "entrainment" of the at least one permanent magnet 18a and 18b, which conventionally often leads to an increase in energy consumption and causes uncontrolled, undesired movements of the adjustable part 10. It is additionally ensured that the rotational movement of the at least one permanent magnet 18a and 18b about the second axis of rotation 20 does not bring about a deformation of the adjustable part 10, in particular of the reflective surface 12.

In the embodiment of FIGS. 1a to 1c, a first bending-actuator-carrying structure 26a is arranged on a first side of the first axis of rotation 16 and a second bending-actuator-carrying structure 26b is arranged on a second side of the first axis of rotation 16. The first permanent magnet 18a contacts the first bending-actuator-carrying structure 26a. Correspondingly, the second permanent magnet 18b contacts the second bending-actuator-carrying structure 26b. A position of the respective permanent magnet 18a and 18b can be chosen such that the position is not impaired or is scarcely impaired by the deformations of the at least one bending actuator 14a to 14d of the contacted bending-actuator-carrying structure 26a or 26b.

In the embodiment described here, the bending-actuator-carrying structures 26a and 26b are carrier surfaces on which the at least one bending actuator 14*a* to 14*d* of the respective bending-actuator-carrying structure 26*a* or 26*b* is formed. Preferably, the carrier surfaces have (perpendicularly in relation to the axes of rotation 16 and 20) a layer thickness that lies below the height of the at least one permanent magnet 18*a* and 18*b* (perpendicularly in relation to the axes of rotation 16 and 20). The layer thickness of the carrier surfaces (perpendicularly in relation to the axes of rotation 16 and 20) may in particular be equal to a spring thickness of the inner springs 24*a* to 24*d* (perpendicularly in relation to the axes of rotation 16 and 20). (The carrier surfaces of the bending-actuator-carrying structures 26*a* and 26*b*, the inner springs 24*a* to 24*d* and the outer springs 22*a* and 22*b* may in particular have the same extent perpendicularly in relation to the axes of rotation 16 and 20). The carrier surfaces of the bending-actuator-carrying structures 26*a* and 26*b* are this case easily deformable and are suitable for the additional "buffering" of the assigned permanent magnet 18*a* and 18*b* from the movement/oscillation of the adjustable part 10 about the first axis of rotation 16.

The at least one permanent magnet 18*a* and 18*b* is consequently not rigidly connected to the adjustable part 10. Similarly, the at least one permanent magnet 18*a* and 18*b* is also not on a "rigid frame". Therefore, the at least one permanent magnet 18*a* and 18*b* is also not forced to join in a movement/deformation of the "rigid frame".

By way of example, in the embodiment described here the first bending-actuator-carrying structure 26*a* has (on a first side of the second axis of rotation 20) a first bending actuator 14*a* and (on a second side of the second axis of rotation 20) a second bending actuator 14*b*. Correspondingly, the second bending-actuator-carrying structure 26*b* also has (on the first side of the second axis of rotation 20) a third bending actuator 14*c* and (on the second side of the second axis of rotation 20) a fourth bending actuator 14*d*.

Furthermore, in the embodiment of FIGS. 1*a* to 1*c* the bending actuators 14*a* to 14*d* are formed in each case as bending arms 14*a* to 14*d*. (Each of the bending actuators 14*a* to 14*d* may in particular also be referred to as a bimetal bending arm 14*a* to 14*d*.) The bending actuators/bending arms 14*a* to 14*d* at least partially enclose the adjustable part 10 and the at least one inner spring 24*a* to 24*d*. As reproduced in FIG. 1*c*, the at least one electrical signal is supplied to the bending actuators/bending arms 14*a* to 14*d* such that the two bending actuators/bending arms 14*a* and 14*b* of the first bending-actuator-carrying structure 26*a* are deformed in phase opposition/phase-shifted by 180° in relation to the bending actuators/bending arms 14*c* and 14*d* of the second bending-actuator-carrying structure 26*b*. This may also be described as an antiparallel deformation of the bending actuators 14*a* and 14*b* of the first bending-actuator-carrying structure 26*a* with respect to the bending actuators/bending arms 14*c* and 14*d* of the second bending-actuator-carrying structure 26*b*. By contrast, the first bending actuator/bending arm 14 of the first bending-actuator-carrying structure 26*a* is deformed mirror-symmetrically in relation to the second bending actuator/bending arm 14*b* of the first bending-actuator-carrying structure 26*a* with respect to a mirror surface extending through the second axis of rotation 20 and the third bending actuator/bending arm 14*c* of the second bending-actuator-carrying structure 26*b* is deformed mirror-symmetrically in relation to the fourth bending actuator/bending arm 14*d* of the second bending-actuator-carrying structure 26*b* with respect to the mirror plane extending through the second axis of rotation 20.

Preferably, the micromechanical component has a control device (not depicted), by means of which the at least one electrical signal can be supplied to the at least one bending actuator 14*a* to 14*d* such that the adjustable part 10 can be set/is set in a resonant oscillating movement with respect to the mounting 11 about the first axis of rotation 16 on the basis of the restoring force resulting from the adjusting movement of the at least one first subregion of the at least one bending actuator 14*a* to 14*d*. By means of the resonant oscillating movement of the adjustable part 10 about the first axis of rotation 16, comparatively great deflections of the adjustable part 10 can be achieved. For example, the maximum deflections of the adjustable part 10 may be when there is a maximum deflection angle of at least 10° and/or when there is a maximum deflection displacement of points of the adjustable part 10 of several 100 µm (micrometers).

During the resonant oscillating movement of the adjustable part 10 about the first axis of rotation 16, the at least one bending actuator 14*a* to 14*d* is moved in the opposite mode to the adjustable part 10. As long as the at least one bending actuator 14*a* to 14*d* is "decoupled" from the at least one bending actuator 14*a* to 14*d* (at least) by means of the at least one inner spring 24*a* to 24*d*, a natural frequency of a harmonic oscillation of the adjustable part 10 about the first axis of rotation 16 is not impaired or is scarcely impaired by a stiffness or a mass of the at least one bending actuator 14*a* to 14*d*. For the adjusting movement of the adjustable part 10 about the first axis of rotation 16, there is consequently a spring-mass system that makes it possible, by the design of the at least one inner spring 24*a* to 24*d* and a mass of the adjustable part 10, to fix a natural frequency of the oscillating movement of the adjustable part 10 about the first axis of rotation 16 to a desired value/range of values. In particular, the natural frequency may be fixed within a comparatively high frequency range, such as for example in the frequency range between 20 kHz (kilohertz) and 30 kHz (kilohertz). It is thereby possible to make use of the advantageous way in which the natural frequency can be fixed to a desired high frequency range for the resonant oscillating movement of the adjustable part 10 about the first axis of rotation 16.

Preferably, the control device is also designed for operating the (component's own) yoke device. It is advantageous if the yoke device (not depicted) can be operated by means of the control device such that the adjustable part 10 can be adjusted/is adjusted by means of the built-up magnetic field together with the at least one permanent magnet 18*a* and 18*b* quasi-statically about the second axis of rotation 20. Since the resonant oscillating movement of the adjustable part 10 about the first axis of rotation 16 does not have an effect or scarcely has an effect on the at least one permanent magnet 18*a* and 18*b*, there is no need to accept damping of the quasi-static adjusting movement of the at least one permanent magnet 18*a* and 18*b* about the second axis of rotation 20. The at least one permanent magnet 18*a* and 18*b* is consequently merely rotated quasi-statically about the static second axis of rotation 20.

As an advantageous development, the at least one bending actuator 14*a* to 14*d* may be weighed down in each case with an additional mass 28*a* to 28*d*. For example, for this purpose an additional mass layer (for example a metal layer and/or a bonded-on silicon layer) may be deposited on the respective bending-actuator-carrying structure 26*a* and 26*b*. Since the nominal movement of the at least one permanent magnet 18*a* and 18*b* is equal to zero, small differences in the mass distributions of the at least one permanent magnet 18*a* and 18*b* have scarcely any influence on the overall system. Inaccuracies in the placement of the at least one permanent magnet 18*a* and 18*b*, such as occur for example when performing a pick-and-place process, therefore scarcely lead to disadvantages or an imbalance.

In the embodiment of FIGS. 1a to 1c, the inner springs 24a to 24d are anchored respectively on the adjustable part 10 at at least one point lying on the first axis of rotation 16. The inner springs 24a to 24d consequently act on the adjustable part 10 at the first axis of rotation 16. This arrangement with an anchoring of the inner springs 24a to 24d on the adjustable part 10 allows a design with an altogether low moment of inertia about the (static) second axis of rotation 20. Furthermore, the inner springs 24a to 24d are anchored respectively on the assigned bending-actuator-carrying structure 26a and 26b with the at least one bending actuator 14a to 14d at at least one point lying on the second axis of rotation 20.

Figure 2A:
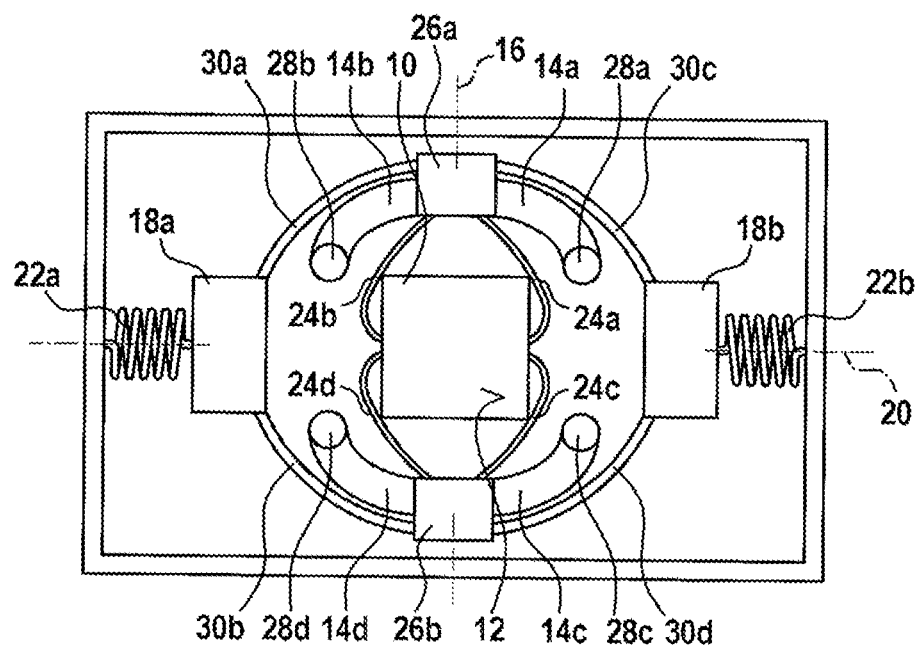
FIGS. 2a to 2c show schematic representations of a second embodiment of the micromechanical component.
Figure 2B:
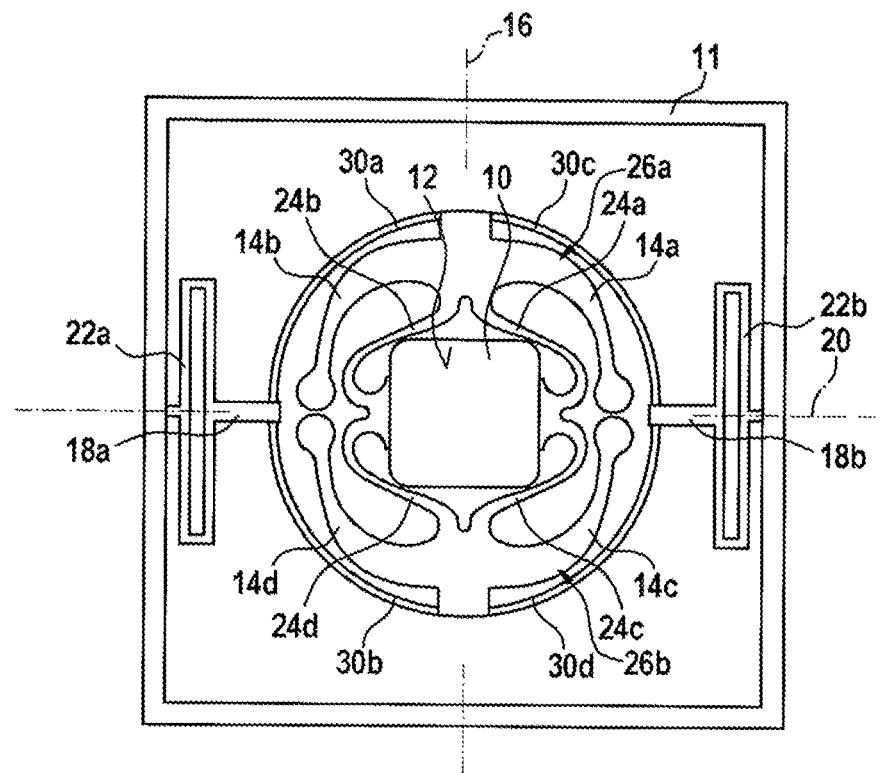
Figure 2C:
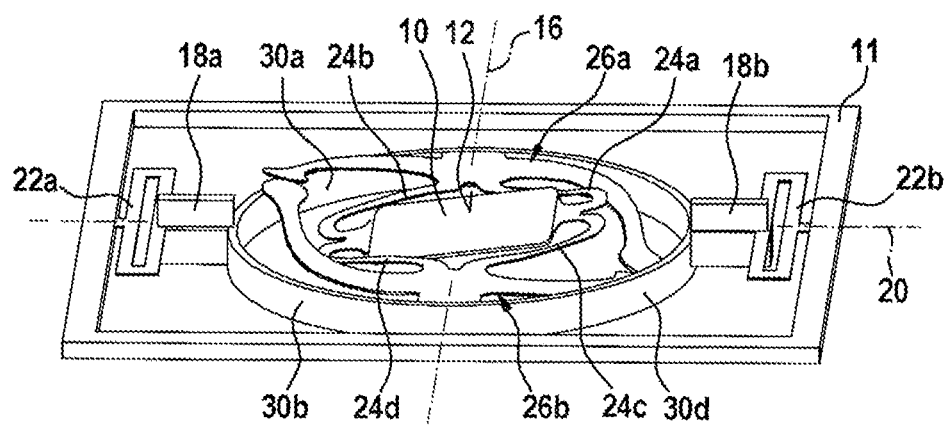

FIGS. 2a to 2c show schematic representations of a second embodiment of the micromechanical component.

As a difference from the embodiment described above, the micromechanical component schematically represented in FIGS. 2a to 2c also has intermediate springs 30a to 30d, by way of which the bending-actuator-carrying structures 26a and 26b are connected to the permanent magnets 18a and 18b. The first permanent magnet 18a is connected to the first bending-actuator-carrying structure 26a by way of a first intermediate spring 30a and to the second bending-actuator-carrying structure 26b by way of a second intermediate spring 30b. Correspondingly, a third intermediate spring 30c extends from the second permanent magnet 18b to the first bending-actuator-carrying structure 26a and a fourth intermediate spring 30d extends from the second permanent magnet 18b to the second bending-actuator-carrying structure 26b. In the embodiment of FIGS. 2a to 2c, the first bending-actuator-carrying structure 26a is arranged on the first side of the second axis of rotation 20 and the second bending-actuator-carrying structure 26b is arranged on the second side of the second axis of rotation 20. By way of example, the first bending actuator 14a and the third bending actuator 14c lie on the second side of the first axis of rotation 16 and the second bending actuator 14b and the fourth bending actuator 14d lie on the first side of the first axis of rotation 16.

In addition, in the embodiment described here the first bending-actuator-carrying structure 26a is connected to the adjustable part 10 by way of the first inner spring 24a and the second inner spring 24b (for example formed symmetrically in relation to the first inner spring 24a with respect to the first axis of rotation 16) and the second bending-actuator-carrying structure 26b is connected to the adjustable part 10 by way of the third inner spring 24c and the fourth inner spring 24d (for example formed symmetrically in relation to the third inner spring 24c with respect to the first axis of rotation 16). Furthermore, the inner springs 24a to 24d are anchored respectively on the adjustable part 10 at at least one point lying on the second axis of rotation 20. The inner springs 24a to 24d consequently act on the adjustable part 10 at the regions of its maximum deflection about the first axis of rotation 16. Furthermore, the inner springs 24a to 24d are anchored respectively on the at least one bending actuator 14a to 14d at at least one point lying on the first axis of rotation 16. Also in the case of this arrangement the permanent magnets 18a and 18b form a mass point of their own, which is not impaired or is scarcely impaired by the resonant oscillating movement of the adjustable part 10 about the first axis of rotation 16.

In the embodiment of FIGS. 2a to 2c, the inner springs 24a to 24d act on the "head end" of the adjustable part 10. It is of course also possible in principle for the inner springs 24a to 24d to act on the points of the adjustable part 10 lying on the first axis of rotation 16. Furthermore, in the embodiment of FIGS. 2a to 2c the mass points on the drive units (PZT wings) are very near the axis (in relation to the second axis of rotation 20), which is advantageous for a low moment of inertia with respect to the second axis of rotation 20.

With respect to further features and the advantages of the micromechanical component of FIGS. 2a to 2c, reference is made to the embodiment described above.

Figure 3:
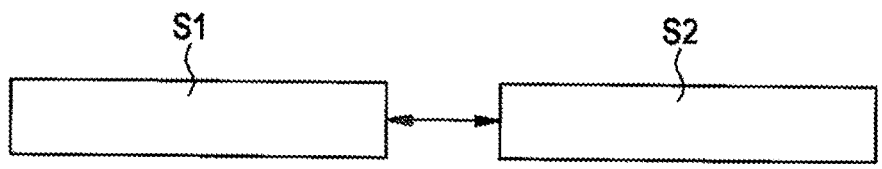
FIG. 3 shows a flow diagram for explaining an embodiment of the method for adjusting an adjustable part simultaneously about two axes of rotation inclined in relation to one another.

FIG. 3 shows a flow diagram for explaining an embodiment of the method for adjusting an adjustable part simultaneously about two axes of rotation inclined in relation to one another.

The method described below may be performed for example by means of one of the micromechanical components described above. It is pointed out however that the method described below is not restricted to use of one of these devices to allow it to be performed.

The method has a method step S1, in which at least the adjustable part is adjusted with respect to a mounting by means of at least one bending actuator about a first axis of rotation of the two axes of rotation inclined in relation to one another. This takes place by the at least one bending actuator being activated by means of at least one electrical signal such that in each case a first subregion of the at least one bending actuator is set in an adjusting movement with respect to in each case a second subregion of the respective bending actuator while undergoing an at least partial deformation of the bending actuator that is respectively activated by means of the at least one electrical signal. In this way, at least the adjustable part is adjusted with respect to the mounting about the first axis of rotation on the basis of a restoring force resulting from the adjusting movement of the at least one first subregion of the at least one bending actuator.

At the same time as the method step S1, a method step S2 is also performed. In the method step S2, at least the adjustable part is adjusted with respect to the mounting about a second axis of rotation of the two axes of rotation inclined in relation to one another, by at least the adjustable part being adjusted by means of a magnetic field together with at least one permanent magnet connected indirectly to the adjustable part about the second axis of rotation. Examples of the indirect connection of the at least one permanent magnet to the adjustable part have already been described above.

Consequently, the method described here also provides the advantages already explained, which we refrain from enumerating once again here.

What is claimed is:
1. A micromechanical component, comprising:
a mounting element;
an adjustable part mounted on the mounting element so as to be simultaneously adjustable about a first axis of rotation and a second axis of rotation inclined with respect to the first axis of rotation;
at least one permanent magnet indirectly connected to the adjustable part such that the adjustable part is adjustable about the second axis of rotation via a magnetic field interacting with the at least one permanent magnet; and
at least one bending actuator that includes a first subregion and a second subregion, wherein:
the at least one bending actuator is configured to at least partially deform in response to receiving at least one electrical signal and move the first subregion in an adjusting movement relative to the second subregion; and the adjusting movement results in a restoring force that acts to adjust the adjustable part about the first axis of rotation with respect to the mounting element.

2. The micromechanical component of claim 1, further comprising:
a yoke device configured to build up the magnetic field together with the at least one permanent magnet.

3. The micromechanical component of claim 1, wherein the at least one permanent magnet is configured to interact with an external yoke device to build up the magnetic field.

4. The micromechanical component of claim 1, further comprising at least one outer spring and at least one inner spring that suspend the adjustable part on the mounting element such that the at least one inner spring is configured to deform about the first axis of rotation and the at least one outer spring is configured to deform about the second axis of rotation as the adjustable part is adjusted relative to the mounting element.

5. The micromechanical component of claim 4, wherein at least one of:
the at least one inner spring is anchored to at least one point of the adjustable part lying on the first axis of rotation and on the at least one bending actuator; and
the micromechanical component further comprises at least one bending-actuator-carrying structure, the at least one inner spring anchored to at least one point on the bending-actuator-carrying structure lying on the second axis of rotation.

6. The micromechanical component of claim 4, further comprising:
at least one intermediate spring;
wherein at least one of:
the at least one bending actuator is connected to the at least one permanent magnet via the at least one intermediate spring; and
the micromechanical component further comprises at least one bending-actuator-carrying structure, the at least one bending-actuator-carrying structure connected to the at least one permanent magnet via the at least one intermediate spring.

7. The micromechanical component of claim 6, wherein the at least one inner spring is anchored to at least one of:
at least one point of the adjustable part lying on the first axis of rotation and on the at least one bending actuator; and
at least one point on the bending-actuator-carrying structure lying on the second axis of rotation.

8. The micromechanical component of claim 1, further comprising:
a control device configured to supply the at least one electrical signal to the at least one bending actuator so as to set the adjustable part in a resonant oscillating movement about the first axis of rotation relative to the mounting element due to the restoring force resulting from the adjusting movement of the first subregion of the at least one bending actuator.

9. The micromechanical component of claim 8, further comprising:
a yoke device that is operable to build up the magnetic field together with the at least one permanent magnet;
wherein the control device is further configured to operate the yoke device so as to adjust the adjustable part quasi-statically about the second axis of rotation via the magnetic field.

10. The micromechanical component of claim 1, wherein the at least one bending actuator further includes at least one of:
at least one piezoelectric material;
at least one thermal-effect material; and
at least one shape-memory material.

11. The micromechanical component of claim 1, wherein the at least one bending actuator is a bimetal bending arm.

12. A micromirror device, comprising:
a micromechanical component, comprising:
a mounting element;
an adjustable part mounted on the mounting element so as to be simultaneously adjustable about a first axis of rotation and a second axis of rotation inclined with respect to the first axis of rotation;
at least one permanent magnet indirectly connected to the adjustable part such that the adjustable part is adjustable about the second axis of rotation via a magnetic field interacting with the at least one permanent magnet; and
at least one bending actuator that includes a first subregion and a second subregion, wherein:
the at least one bending actuator is configured to at least partially deform in response to receiving at least one electrical signal and move the first subregion in an adjusting movement relative to the second subregion; and
the adjusting movement results in a restoring force that acts to adjust the adjustable part about the first axis of rotation with respect to the mounting element.

13. A method of adjusting an adjustable part simultaneously about two axes of rotation that are inclined relative to each other, comprising:
in response to at least one electrical signal, activating at least one bending actuator so as to at least partially deform the at least one bending actuator and set a first subregion of the at least one bending actuator in an adjusting movement with respect to a second subregion of the at least one bending actuator, the adjusting movement configured to result in a restoring force that acts to adjust the adjustable part about a first axis of rotation with respect to a mounting element on which the adjustable part is mounted; and
simultaneously to the adjusting of the adjustable part about the first axis, adjusting the adjustable part about a second axis of rotation relative to the mounting element that is inclined relative to the first axis of rotation via a magnetic field interacting with a permanent magnet connected indirectly with the adjustable part.

* * * * *